(12) United States Patent
Robin

(10) Patent No.: US 11,581,295 B2
(45) Date of Patent: Feb. 14, 2023

(54) OPTOELECTRONIC DEVICE

(71) Applicant: Aledia, Echirolles (FR)

(72) Inventor: Ivan-Christophe Robin, Grenoble (FR)

(73) Assignee: Aledia, Echirolles (FR)

( * ) Notice: Subject to any disclaimer, the term of this patent is extended or adjusted under 35 U.S.C. 154(b) by 6 days.

(21) Appl. No.: 17/251,762

(22) PCT Filed: Jun. 11, 2019

(86) PCT No.: PCT/FR2019/051410
§ 371 (c)(1),
(2) Date: Dec. 11, 2020

(87) PCT Pub. No.: WO2019/239059
PCT Pub. Date: Dec. 19, 2019

(65) Prior Publication Data
US 2021/0134777 A1 May 6, 2021

(30) Foreign Application Priority Data
Jun. 14, 2018 (FR) ...................................... 1870698

(51) Int. Cl.
*H01L 25/16* (2006.01)
*H01L 27/15* (2006.01)
(Continued)

(52) U.S. Cl.
CPC .......... *H01L 25/167* (2013.01); *H01L 27/156* (2013.01); *H01L 33/505* (2013.01);
(Continued)

(58) Field of Classification Search
None
See application file for complete search history.

(56) References Cited

U.S. PATENT DOCUMENTS

2017/0358562 A1   12/2017   Banna et al.

FOREIGN PATENT DOCUMENTS

EP    3 070 752 A1    9/2016
EP    3 401 958 A1    11/2018
(Continued)

OTHER PUBLICATIONS

International Preliminary Report on Patentability for International Application No. PCT/FR2019/051410, dated Dec. 24, 2020.
(Continued)

*Primary Examiner* — Bo B Jang
(74) *Attorney, Agent, or Firm* — Wolf, Greenfield & Sacks, P.C.

(57) ABSTRACT

A method of manufacturing an optoelectronic device, including the steps of: forming, on a first surface of a first including assemblies of electronic components, a stack of insulating layers and of conductive tracks; forming, on another wafer, light-emitting diodes each comprising ends; forming a metal layer on at least a portion of the surface of the first wafer and another metal layer on at least a portion of the surface of the second wafer, the other metal layer being electrically coupled to the end of each light-emitting diode; placing into contact the metal layers; forming an insulated conductive via connecting another surface of the wafer to a conductive track; and forming insulated conductive trenches surrounding diodes.

20 Claims, 7 Drawing Sheets

(51) Int. Cl.
*H01L 33/50* (2010.01)
*H01L 33/62* (2010.01)

(52) U.S. Cl.
CPC ...... *H01L 33/62* (2013.01); *H01L 2933/0041* (2013.01); *H01L 2933/0066* (2013.01)

(56) References Cited

FOREIGN PATENT DOCUMENTS

| FR | 3 023 066 A1 | 1/2016 |
| WO | WO 2011/048318 A1 | 4/2011 |
| WO | WO 2018/002485 A1 | 1/2018 |

OTHER PUBLICATIONS

International Search Report and Written Opinion for International Application No. PCT/FR2019/051410, dated Sep. 27, 2019.
Preliminary Search Report for French Application No. 1870698, dated Feb. 19, 2019.

OPTOELECTRONIC DEVICE

This application is a national stage filing under 35 U.S.C. § 371 of International Patent Application Serial No. PCT/FR2019/051410, filed Jun. 11, 2019, which claims priority to French patent application FR18/70698, filed Jun. 14, 2018. The contents of these applications are incorporated herein by reference in their entireties.

TECHNICAL BACKGROUND

The present disclosure relates to an optoelectronic device, particularly a display screen or an image projection device, comprising light-emitting diodes made up of semiconductor materials and their manufacturing methods.

PRIOR ART

A display pixel of an image corresponds to the unit element of the image displayed by the optoelectronic device. When the optoelectronic device is a color image display screen, it generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the display pixel of the displayed image. In this case, the assembly formed by the three display sub-pixels used to display a pixel of an image is called display pixel of the optoelectronic device.

Each display sub-pixel may comprise a light source, particularly one or a plurality of light-emitting diodes, for example, made up of semiconductor materials. A known method of manufacturing an optoelectronic device, particularly a display screen or an image projection device, comprising light-emitting diodes, called "pick-and-place" method, comprises manufacturing the light-emitting diodes in the form of separate components and placing each light-emitting diode at a desired position on a support which may comprise conductive tracks for the electric connection of the light-emitting diodes.

A disadvantage of such a method is that it generally requires accurately placing the light-emitting diodes on the support. This requires implementing alignment methods which are all the more complex as the dimensions of the light-emitting diodes are decreased.

Another disadvantage of such a method is that an increase in the resolution of the optoelectronic device results in an increase in the number of transfers of light-emitting diodes onto the support and thus in an increase in the duration of the optoelectronic device manufacturing, which may be incompatible with a manufacturing at an industrial scale.

To form a large light-emitting diode display screen made up of assembled unit light-emitting diodes, the light-emitting diodes should be assembled with control circuits which control a number of light-emitting diodes. The assemblies comprising the control circuits and the light-emitting diodes are then coupled together by wires. Such an assembly decreases the quantity of data capable of being transmitted and it may be difficult to display a video stream.

For display screens comprising micrometer-range light-emitting diodes, for example for TV, tablet, smart phone type formats which are currently being developed by several manufacturers, an active matrix is necessary to display a video stream with a high resolution. Currently, active matrices for display screens are formed with thin film transistors, or TFTs. TFTs generally use deposits of amorphous silicon or polysilicon on large glass surface areas and require using complex microelectronics methods on large surface areas.

It would be desirable to be able to form so-called smart pixels integrating with the light-emitting diodes, particularly of micrometer-range size, control electronics to form TFT-less active matrices. Such active matrices may be formed on very large surface areas since they are based on the electronic circuits embarked under the display pixel. On the other hand, such electronic circuits may take advantage of silicon-based technologies.

SUMMARY

An embodiment provides a method of manufacturing an optoelectronic device, comprising the steps of:
  forming, on a first surface of a first wafer comprising assemblies of electronic components, a stack of first insulating layers and of conductive tracks;
  forming, on a second wafer, assemblies of three-dimensional light-emitting diodes, each comprising first and second ends;
  forming a first metal layer on at least a portion of the first surface of the first wafer and a second metal layer on at least a portion of a first surface of the second wafer, the second metal layer being electrically coupled to the first end of each light-emitting diode;
  placing into contact the first and second metal layers to bond them by molecular bonding;
  forming at least one insulated conductive via connecting a second surface of the first wafer to one of the conductive tracks; and
  forming insulated conductive trenches surrounding each assembly of light-emitting diodes and laterally insulating from one another portions of the first and second metal layers, each portion being connected to one of the assemblies of light-emitting diodes.

According to an embodiment, some of the conductive tracks interconnect electronic components of the first wafer and conductive elements extend in the first insulating layers of the stack and are in contact with the first metal layer.

According to an embodiment, each portion of the first and second metal layers surrounded with a trench is connected to the first wafer by one of the conductive elements.

According to an embodiment, the first and second metal layers totally cover the first surfaces of the first and second wafers.

According to an embodiment, the method comprises a step of forming an electrode electrically connecting the second ends of all the light-emitting diodes.

According to an embodiment, the insulated conductive trenches extend from the electrode to some of the conductive tracks.

According to an embodiment, the insulated conductive trenches extend from the second surface of the first wafer to the electrode.

According to an embodiment, the first and second metal layers are placed into contact before the forming of a photoluminescent layer covering the electrode.

According to an embodiment, each trench is connected to one of the insulated conductive vias.

According to an embodiment, the method comprises the forming of a second electrically-insulating layer covering the light-emitting diodes, the second insulating layer being crossed by electrically-conductive walls.

According to an embodiment, each assembly of electronic components comprises a circuit for controlling the light-emitting diodes of the corresponding assembly of light-emitting diodes.

According to an embodiment, the method comprises a step of thinning of the second wafer before the forming of the second metal layer.

According to an embodiment, the 3D light-emitting diodes are wire-shaped, conical, or frustoconical diodes.

According to an embodiment, the method comprises a step during which the first and second wafers are etched to form chips.

Another embodiment provides an optoelectronic device comprising:
a first chip comprising assemblies of electric components and a stack of first insulating layers and of conductive tracks, a first surface of the first chip being at least partially covered with a first metal layer, at least one insulated conductive via connecting a second surface of the first chip to one of the conductive tracks;
a second chip comprising assemblies of 3D light-emitting diodes, each light-emitting diode having a first and a second end, a first surface of the second chip being at least partially covered with a second metal layer, the second metal layer being electrically coupled to the first ends of all the light-emitting diodes, the first and second metal layers being bonded to each other by molecular bonding; and
insulated conductive trenches surrounding each assembly of light-emitting diodes and laterally insulating portions of the first and second metal layers connected to each assembly of light-emitting diodes.

According to an embodiment, some of the conductive tracks interconnect electronic components of the first wafer and conductive elements comprised within the first insulating layers of the stack are in contact with the first metal layer.

According to an embodiment, each portion of the first and second metal layers surrounded with a trench is connected to the first wafer by one of the conductive elements.

According to an embodiment, the first and second metal layers totally cover the first surfaces of the first and second wafers.

According to an embodiment, an electrode electrically connects the second ends of all the light-emitting diodes.

According to an embodiment, the insulated conductive trenches extend from the electrode to a conductive track of the stack.

According to an embodiment, the insulated conductive trenches extend from the second surface of the first wafer to the electrode.

According to an embodiment, each trench is connected to one of the insulated conductive vias.

According to an embodiment, a second electrically-insulating layer covers the light-emitting diodes, the insulating layer being crossed by electrically-conductive walls.

According to an embodiment, the second metal layer is in contact with the first ends of the light-emitting diodes.

According to an embodiment, each assembly of electronic components comprises a circuit for controlling the light-emitting diodes of a corresponding assembly of light-emitting diodes.

According to an embodiment, the 3D light-emitting diodes are wire-shaped, conical, or frustoconical diodes.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the applications of the described devices will not be detailed.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to a . . . in a normal position of use.

It is here considered that the terms "insulating" and "conductive" signify "electrically insulating" and "electrically conductive".

Unless specified otherwise, the expressions "around", "approximately", "substantially" and "in the order of" signify within 10%, and preferably within 5%.

The present description relates to optoelectronic devices comprising three-dimensional or 3D elements, for example, wire-shaped elements (microwires or nanowires), conical elements, or frustoconical elements. More particularly, the described devices comprise wire-shaped light-emitting diodes. However, such embodiments may be implemented for three-dimensional elements other than wire-shaped diodes, for example, pyramid-shaped three-dimensional elements.

The term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

Figure 1:
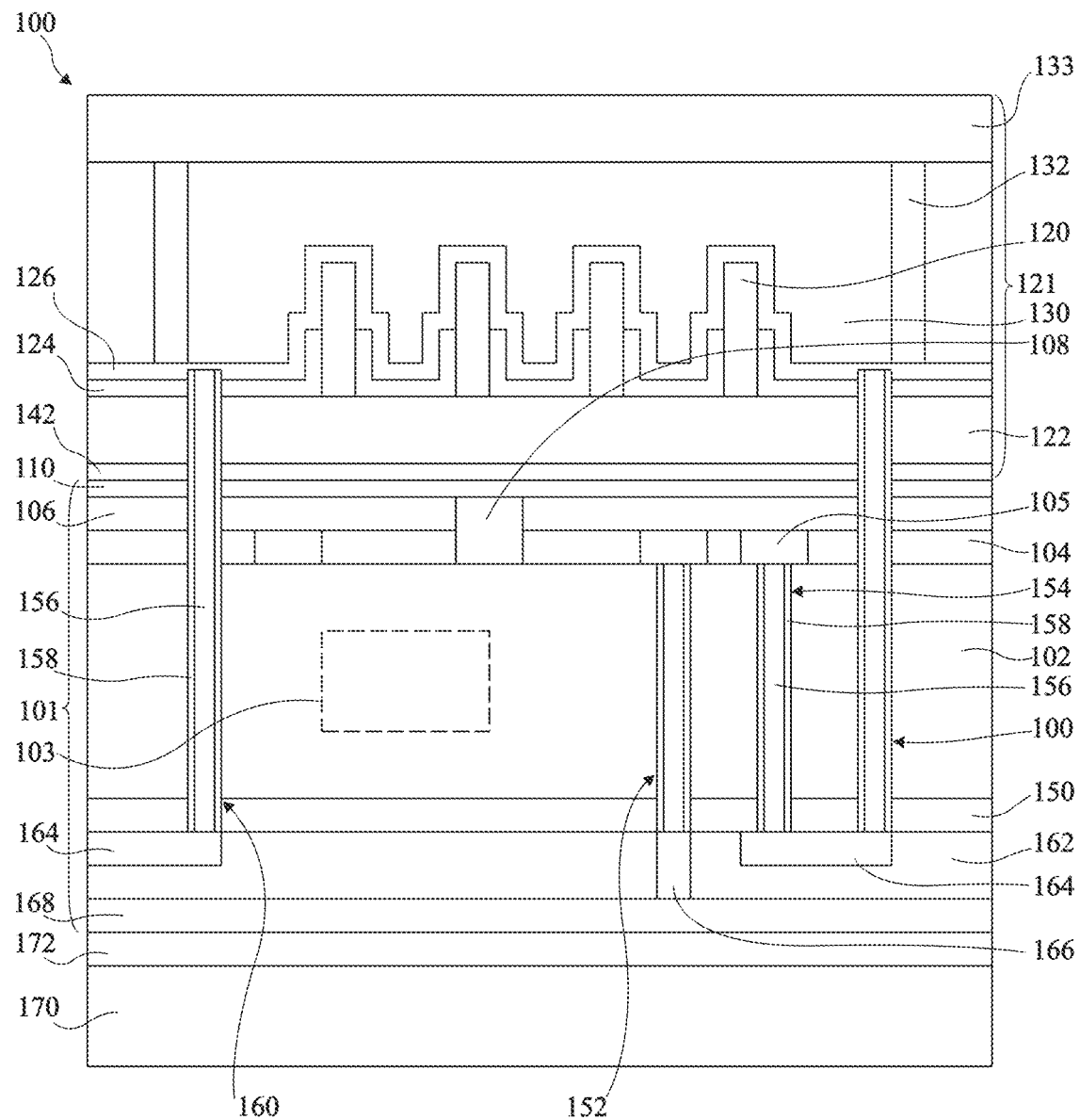
FIG. 1 shows a portion of an embodiment of an optoelectronic device.

FIG. 1 shows a portion of an embodiment of an optoelectronic device 100, for example, a display screen. More particularly, FIG. 1 shows a display sub-pixel of a display pixel of optoelectronic device 100. The display pixel for example comprises a plurality of display sub-pixels, for example at least three display sub-pixels. Such a display pixel for example comprises at least one display sub-pixel capable of delivering a blue radiation, one display sub-pixel capable of delivering a red radiation, and one display sub-pixel capable of delivering a green radiation.

The display pixel comprises an electronic circuit 101. Circuit 101 comprises a semiconductor substrate 102 inside and on top of which are formed assemblies of electronic components 103, very schematically shown in FIG. 1. More particularly, each display sub-pixel comprises an assembly of electronic components 103.

Substrate 102 is covered with a stack of at least one insulating layer, the stack further comprising conductive tracks 105 of a first metallization level. In FIG. 1, the stack comprises two insulating layers 104 and 106. The conductive tracks 105 of layer 104 are for example used to interconnect the electronic components 103 of a same assembly.

The display pixel further comprises an optoelectronic circuit 121. Circuit 121 comprises a semiconductor substrate 122 having assemblies of light-emitting diodes 120 formed thereon. More particularly, the display pixel comprises as many assemblies of light-emitting diodes as display sub-pixels, each display sub-pixel comprising an assembly of light-emitting diodes.

Light-emitting diodes 120 are three-dimensional diodes such as previously mentioned. An example of light-emitting diodes 120 is described in US patent application 2015/0255677. A single assembly of light-emitting diodes 120 is shown in FIG. 1, this assembly comprising four light-emitting diodes. In practice, an assembly of light-emitting diodes may comprise from one to several tens of light-emitting diodes.

Each assembly of electronic components 103 for example comprises a light-emitting diode control circuit. The assemblies of electronic components 103 are for example capable of controlling an assembly of light-emitting diodes based on the modulation of the voltage across the assemblies of light-emitting diodes. Such circuits are described in French patent application FR1756984 of the applicant.

Electronic circuit 101 comprises a metal layer 110, covering insulating layer 106, and optoelectronic circuit 121 comprises a metal layer 142, covering the surface of substrate 122 opposite to light-emitting diodes 120. Metal layers 110 and 142 are in contact with each other. Metal layers 110 and 142 are bonded by metal-to-metal molecular bonding and enable to bond electronic circuit 101 to optoelectronic circuit 121.

Electronic circuit 101 comprises a conductive element 108, for example comprising conductive tracks located in layers 104 and 106. Conductive element 108 enables to form an electric connection between each assembly of electronic components 103 and metal layer 110. Conductive element 108 thus enables, for each assembly of electronic components 103, to form an electric connection between the assembly of electronic components 103 of a display sub-pixel and the substrate 122 of the same display sub-pixel via metal layers 110 and 142.

Optoelectronic circuit 121 comprises an insulating layer 124 which covers substrate 122 around light-emitting diodes 120 and which covers a lower portion of each light-emitting diode. Optoelectronic circuit 121 further comprises a conductive layer 126 which totally covers substrate 122, that is, it covers insulating layer 124 and the portions of light-emitting diodes 120 which are not covered with insulating layer 124. Conductive layer 126 is at least partially transparent to the radiation emitted by the light-emitting diodes. Conductive layer 126 corresponds to an electrode of light-emitting diodes 120. This electrode is preferably an electrode common to all the light-emitting diodes 120 of the display sub-pixel.

Optoelectronic circuit 121 comprises, for each display sub-pixel, an insulating photoluminescent layer 130 covering the portion of conductive layer 126 associated with the display sub-pixel. Photoluminescent layer 130 is for example capable of absorbing at least part of the radiation emitted by the light-emitting diodes and of emitting a radiation at another wavelength. Photoluminescent layer 130 for example comprises quantum dots or luminophores. The composition of photoluminescent layer 130 differs according to the considered display sub-pixel. Thus, certain photoluminescent layers 130 may be capable of transforming the radiation emitted by the light-emitting diodes of the display sub-pixel into a blue, green, or red radiation.

As a variant, substrate 122 may be absent. Metal layer 142 is then directly in contact with light-emitting diodes 120 and insulating layer 124 or with a conductive nucleation layer allowing the growth thereof.

Optoelectronic circuit 121 comprises conductive walls 132 which extend from layer 126 to the surface of photoluminescent layers 130 opposite to substrate 122. For example, walls 132 surround each assembly of light-emitting diodes 120.

Optoelectronic circuit 121 comprises a conductive layer 133 at least partially transparent to the radiation emitted by the display pixel, and covering photoluminescent layers 130. Conductive layer 133 is for example in contact with and is for example electrically connected to the ends of walls 132.

As a variant, photoluminescent layer 130 may conformally cover light-emitting diodes 120 and may be covered with a transparent insulating layer, for example, made of silicon.

Electronic circuit 101 further comprises an insulating layer 150 located on the surface of substrate 102 opposite to insulating layers 104 and 106. Insulated conductive vias 152 and 154 cross insulating layer 150 and substrate 102 to reach some of conductive tracks 105. Insulated conductive vias 152 and 154 each comprise a conductive core 156 surrounded with an insulating sheath 158 open at the ends of the vias to allow an electric connection.

The display pixel further comprises insulated conductive trenches 160 located to surround each display sub-pixel Each trench 160 comprises, like vias 152 and 154, an insulating sheath 158 and a conductive core 156. Trenches 160 cross insulating layer 150, substrate 102, insulating layers 104 and 106, metal layers 110 and 142, substrate 122 (if present), and insulating layer 124. Trenches 160 delimit portions of substrate 122 under each assembly of light-emitting diodes 120. The delimited portions are electrically insulated from the rest of substrate 122. Preferably, layers 110 and 142 respectively entirely cover the surfaces of electronic circuit 101 and of optoelectronic circuit 121 on which they are formed, except for trenches 160.

Electronic circuit 101 comprises a sack of insulating layers 162, further comprising conductive tracks formed on the surface of insulating layer 150 opposite to substrate 102. In particular, conductive tracks 164 are formed to connect one end of one of trenches 160 to one end of a via 154 of each display sub-pixel. Further, electronic circuit 101 comprises a metal layer 168 covering the surface of the stack of layers 162 opposite to insulating layer 150. The stack of layers 162 comprises conductive elements 166, for example comprising conductive tracks located in layers 162. Conductive elements 166 enable to connect one end of at least one via 152 of each display sub-pixel to metal layer 168.

The display pixel is bonded to a support 170 by metal-to-metal molecular bonding between metal layer 168 and a metal layer forming a pad 172 located on support 170.

As a variant, support 170, instead of being covered with metal layer 172, may be covered with a stack of at least one insulating layer and of first conductive tracks. Further, the stack of layers 162 may comprise second conductive tracks opposite the first conductive tracks. The first conductive tracks are located in such a way that each first track is in contact with a second track. The insulating layers comprising the first and second tracks are thus bonded by hybrid molecular bonding. Electronic and optoelectronic circuits 101 and 121 may be similarly bonded to each other.

In operation, a first power supply potential, for example, a high potential, is applied to conductive layer 133. The power supply potential is thus applied to a first end of light-emitting diodes 120 via walls 132 and conductive layer 126. The power supply potential is further delivered to the assembly of electronic components 103 of each display sub-pixel via trenches 160, conductive tracks 164, vias 154, and conductive tracks 105. The assemblies of electronic components 103 are also connected to a second power supply potential, for example, a low potential, for example, the ground, via conductive tracks 105, vias 152, conductive elements 166, conductive layer 168, pads 172, and support 170.

The assembly of electronic components 103 of each display sub-pixel delivers, based on these potentials, a control signal supplied to the second ends of light-emitting diodes 120 via conductive element 108, portions of metal layers 110 and 142 surrounded with trenches 160, and substrate 122.

Figure 6:
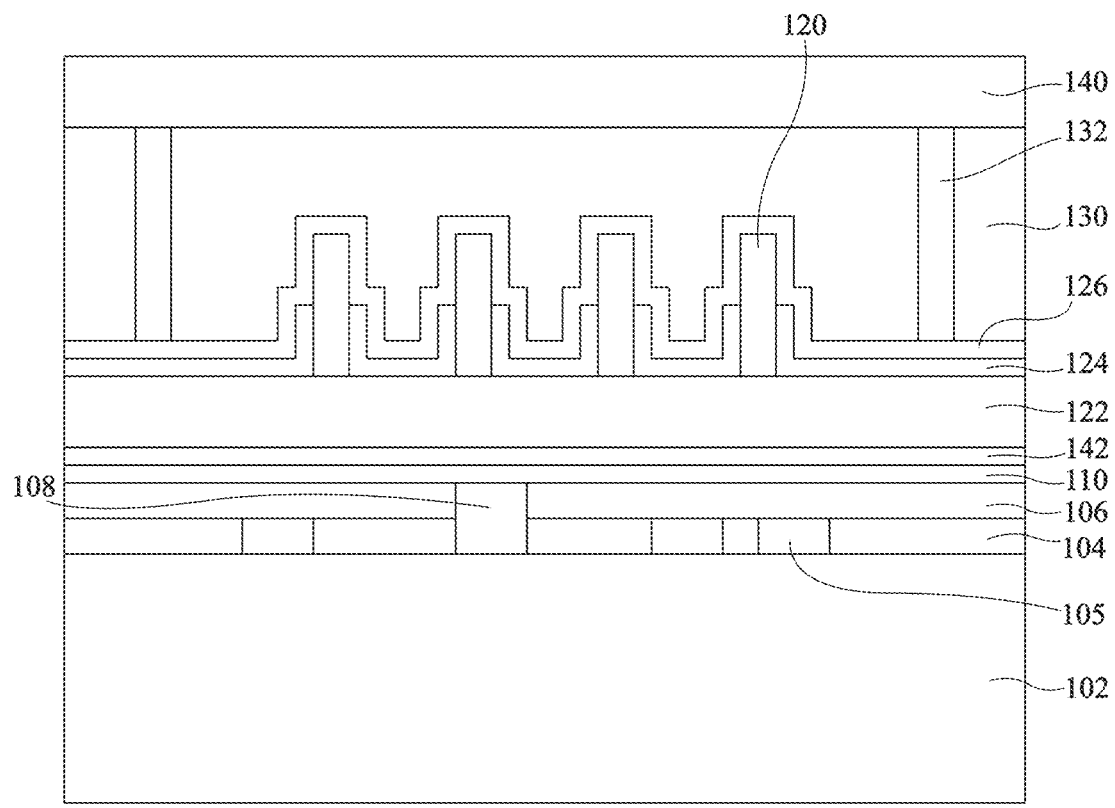
FIG. 6 illustrates the result of steps of an embodiment of a method of manufacturing the device of FIG. 1.
Figure 7:
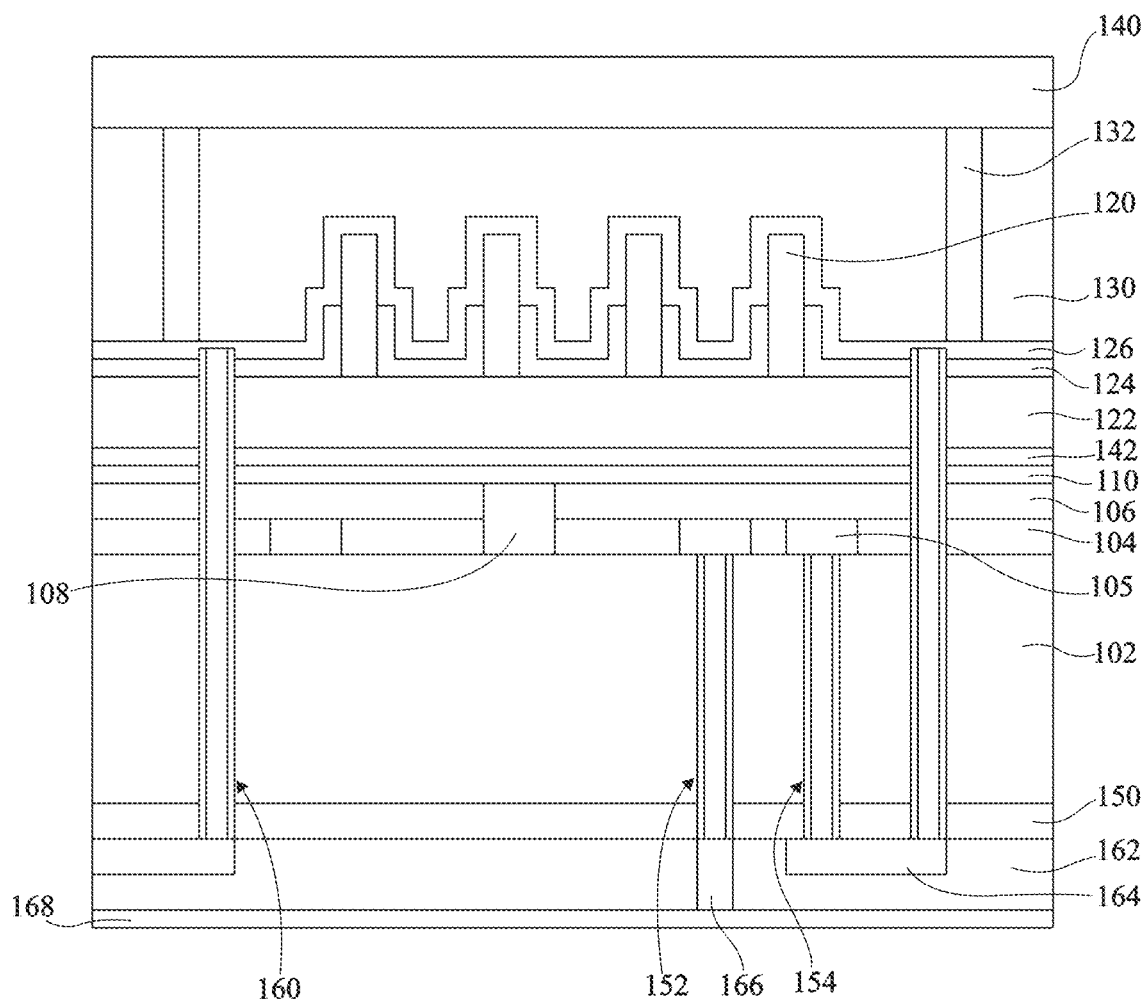
FIG. 7 illustrates the result of steps of an embodiment of a method of manufacturing the device of FIG. 1.
Figure 8:
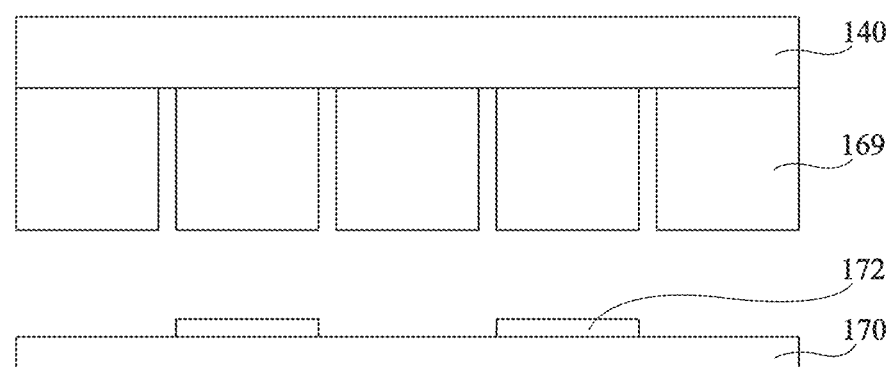
FIG. 8 illustrates the result of steps of an embodiment of a method of manufacturing the device of FIG. 1.

FIGS. 2 to 8 illustrate the results of steps, preferably successive, of an embodiment of a method of manufacturing of the optoelectronic device 100 of FIG. 1. More particularly, FIGS. 2 to 7 illustrate the manufacturing of a display sub-pixel comprising an assembly of light-emitting diodes and an assembly of electronic components. FIG. 8 illustrates the installation of the display pixels.

Substrates 102 and 122 may each correspond to a monoblock structure or may correspond to a layer covering a support made of another material. Substrates 102 and 122 are preferably each a semiconductor substrate, for example, a substrate made of silicon, of germanium, of silicon carbide, of a III-V compound, or of a II-VI compound, for example, of ZnO. Substrates 102 and 122 may also be made of sapphire or of graphene. Preferably, substrates 102 and 122 are single-crystal silicon substrates. Preferably, these are semiconductor substrates compatible with manufacturing methods implemented in microelectronics. Substrates 102 and 122 may correspond to a multilayer structure of silicon-on-insulator type, also called SOI. Substrates 102 and 122 may be heavily doped, lightly-doped, or non-doped.

Examples of group-II chemical elements comprise group-IIA chemical elements, particularly beryllium (Be) and magnesium (Mg), and group-IIB chemical elements, particularly zinc (Zn), cadmium (Cd), and mercury (Hg). Examples of group-VI chemical elements comprise group-VIA chemical elements, particularly oxygen (O) and tellurium (Te). Examples of II-VI compounds are ZnO, ZnMgO, CdZnO, CdZnMgO, CdHgTe, CdTe, or HgTe. Generally, the chemical elements in the II-VI compound may be combined with different molar fractions.

Examples of group-III chemical elements comprise gallium (Ga), indium (In), or aluminum (Al). Examples of group-V chemical elements comprise nitrogen, phosphorus, or arsenic. Examples of III-N compounds are GaN, AlN, InN, InGaN, AlGaN, or AlInGaN. Generally, the chemical elements in the III-V compound may be combined with different molar fractions.

The different insulating elements (layers, sheaths) may be made of a dielectric material or comprise a stack of dielectric layers, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of diamond.

Conductive cores 156 are made of a filling material. The filling material may correspond to a semiconductor or electrically-conductive material. The conductive cores are for example made of silicon, of germanium, of silicon carbide, of a III-V compound, such as GaN, InP, or GaAs, of a II-VI compound, for example ZnO, of tungsten (W), of copper (Cu). Preferably, each conductive core is made of polysilicon. Preferably, each conductive core is made of a material compatible with the manufacturing methods implemented in microelectronics. Each conductive core may be heavily doped, lightly doped, or non-doped.

Figure 2:
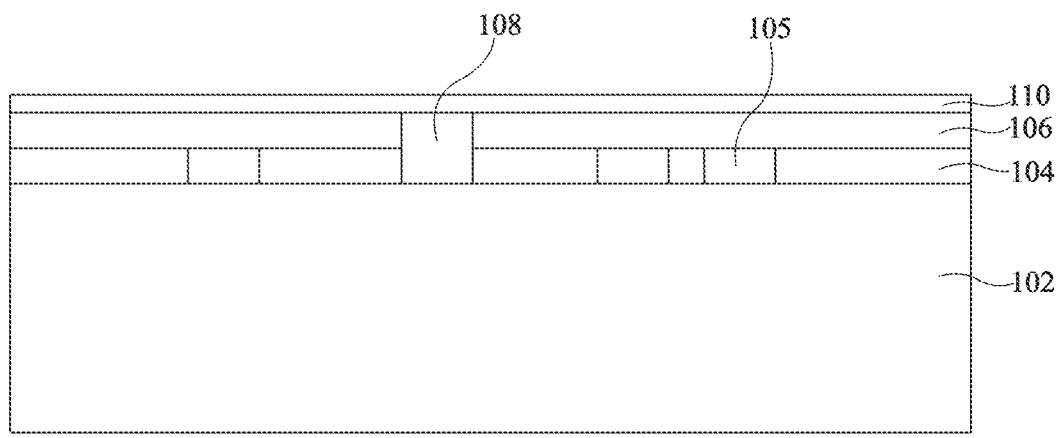
FIG. 2 illustrates the result of steps of an embodiment of a method of manufacturing the device of FIG. 1.

FIG. 2 partially illustrates the forming of electronic circuit 101 and more particularly the result of a step during which the assemblies of electronic components (not shown) are formed inside and on top of substrate 102. At this stage of the manufacturing method, substrate 102 corresponds to a wafer and is used for the simultaneous manufacturing of electronic circuits 101.

In particular, the stack of insulating layers 104 and 106 and conductive tracks 105 are formed. Conductive elements 108 are also formed. Layer 106 is covered, all over wafer 102, with metal layer 110.

Figure 3:
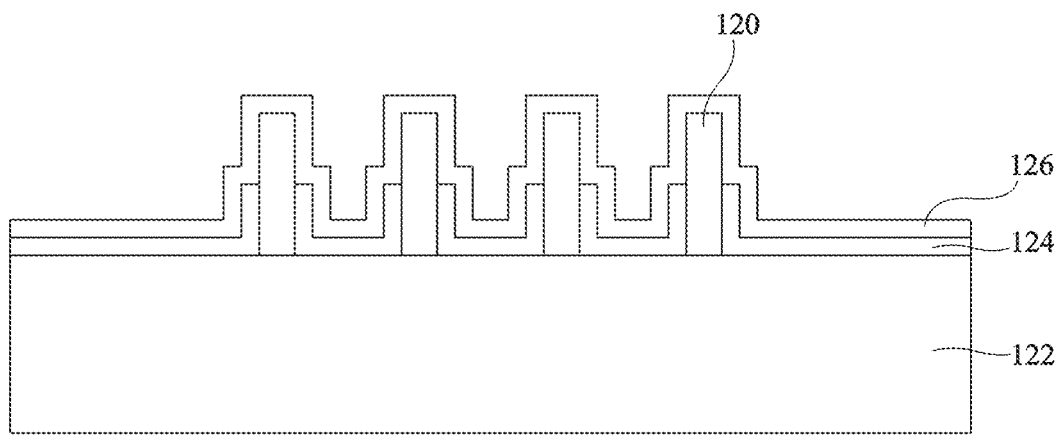
FIG. 3 illustrates the result of steps of an embodiment of a method of manufacturing the device of FIG. 1.

FIG. 3 partially illustrates the forming of optoelectronic circuit 121 and more particularly the result of a step during which the assemblies of light-emitting diodes 120 are formed on substrate 122. A single assembly of light-emitting diodes 120 is shown in FIG. 3, this assembly comprising four elementary light-emitting diodes. In practice, an assembly of light-emitting diodes may comprise from one to several hundreds of light-emitting diodes.

At this stage of the manufacturing method, substrate 122 corresponds to a wafer and comprises a large number of assemblies of light-emitting diodes. Preferably, the wafer corresponding to substrate 122 has substantially the same dimensions as the wafer corresponding to substrate 102 and the number of assemblies of light-emitting diodes 120 corresponds to the number of assemblies of electronic components 103.

Insulating layer 124 and conductive layer 126, forming the electrode, are formed all over the wafer of substrate 102. Electrode 126 is preferably common to all the light-emitting diodes 120 of the wafer.

Figure 4:
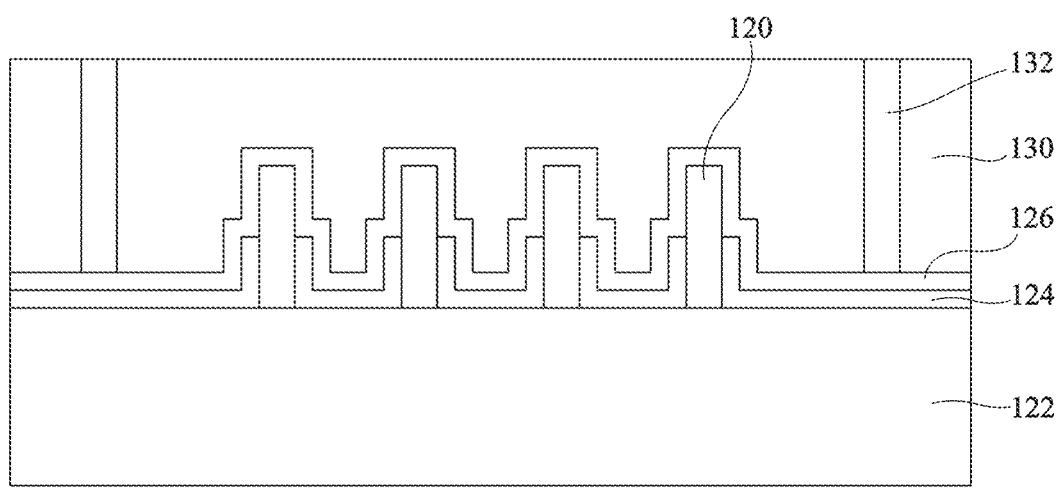
FIG. 4 illustrates the result of steps of an embodiment of a method of manufacturing the device of FIG. 1.

FIG. 4 illustrates the result of another step during which conductive walls 132 are formed on conductive layer 126. Photoluminescent layer 130 is formed, for each display sub-pixel, in the location delimited by walls 132.

Figure 5:
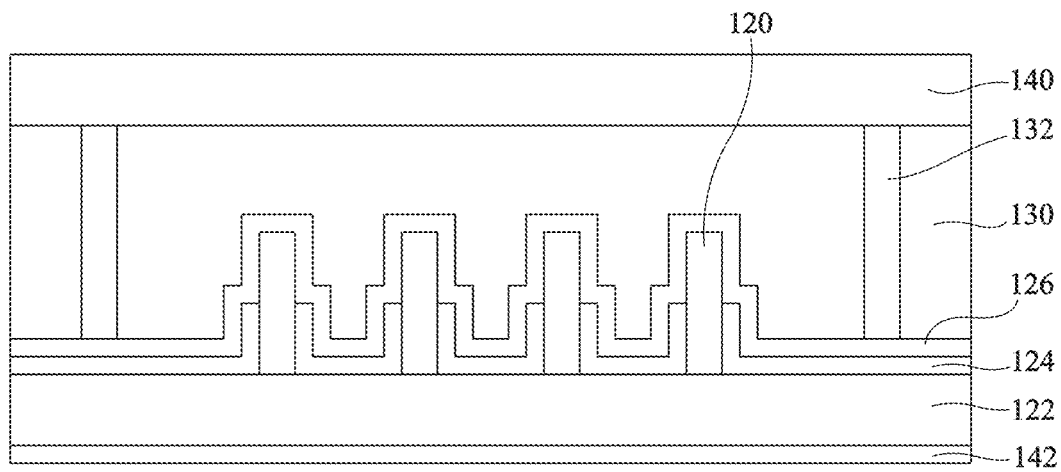
FIG. 5 illustrates the result of steps of an embodiment of a method of manufacturing the device of FIG. 1.

FIG. 5 illustrates another step during which a handle 140 is bonded to the free surface of photoluminescent layers 130.

Substrate 122 is then thinned. Metal layer 142 is formed on the free surface of substrate 122, that is, the surface opposite to the surface having light-emitting diodes 120 formed thereon. Metal layer 142 is formed all over the wafer. Handle 140 enables to manipulate wafer 122 without causing a deformation at the level of the wafer during the thinning step and after this step. Metal layer 142 for example totally covers substrate 122.

As a variant, substrate 122 may be totally removed. Metal layer 142 is then formed in direct contact with insulating layer 124 and with an end of each light-emitting diode 120.

FIG. 6 illustrates another step during which the optoelectronic circuit wafer and the electronic circuit wafer are placed into contact with each other. More particularly, metal layers 142 and 110 are placed into contact with each other. The two wafers are thus bonded by metal-to-metal molecular bonding. Each assembly of light-emitting diodes is located substantially opposite an assembly of electronic components 103 capable of controlling this assembly of light-emitting diodes. There thus is an electric connection, via substrate 122, of layers 142 and 110 and of conductive element 108, between one of the ends of each light-emitting diode 120 of an assembly of photoluminescent diodes and the electronic components of the associated assembly of electronic components 103.

FIG. 7 illustrates the result of a step during which insulating layer 150 is deposited on the free surface of substrate 102. Insulated conductive vias 152 and 154 are formed through insulating layer 150 and substrate 102 to reach some of the conductive tracks.

Insulated conductive trenches 160 are formed to surround each display sub-pixel. Trenches 160 cross insulating layer 150, substrate 102, layers 104 and 106, metal layers 110 and 142, substrate 122 (if it has not been totally removed), and insulating layer 124. Trenches 160 thus connect the free surface of insulating layer 150 to electrode 126.

Insulating layers 162 and conductive tracks 164 and 166 are formed on the free surface of insulating layer 150. In particular, conductive tracks 164 are formed to connect one end of trenches 160 to one end of a via 154 of each display sub-pixel. Further, conductive tracks 166 are formed to connect one end of vias 152 to the free surface of layers 162. Preferably, layers 110 and 142 entirely cover the surface of electronic and optoelectronic circuits 101 and 121 on which they are formed before the forming of trenches 160. After the forming of trenches 160, layers 110 and 142 preferably entirely cover the surfaces of electronic and optoelectronic circuits 101 and 121 on which they are formed except for trenches 160, which cross them.

Metal layer 168 is deposited on the free surface of the stack of insulating layers 162. Layer 168 is thus in contact with conductive elements 166 and is thus connected to a conductive track 105.

Trenches 160 are thus formed after the placing into contact of optoelectronic circuit 121 and of electronic circuit 121.

FIG. 8 illustrates the result of a step during which trenches are dug between display pixels 169 to individualize them. Display pixels 169 however remain fixed to handle 140.

To form a display screen, a number of display pixels 169 are deposited on support 170. For this purpose, metal pads 172 are formed at the desired locations of display pixels 169. Handle 140 is then placed so as to place one display pixel opposite each metal pad 172. The intervals between pads 172 are preferably selected so that each display pixel 169 of a display screen may be placed, at the same time, opposite the corresponding pad 172. As a variant, the display pixels may be deposited in several steps. Display pixels 169 are then placed into contact with pads 72 to bond by molecular bonding pad 172 to metal layer 168, which is common to all the display sub-pixels of each display pixel 169. Handle 140 and the display pixels which have not been placed against pads 172 yet are then removed.

During a subsequent step, not shown, an insulating layer is deposited on support 170 and on the display pixels in such a way that one end of each wall 132 of each display pixel 169 remains exposed. Conductive layer 133 is then deposited on the insulating layer, in contact with walls 132.

Figure 9:
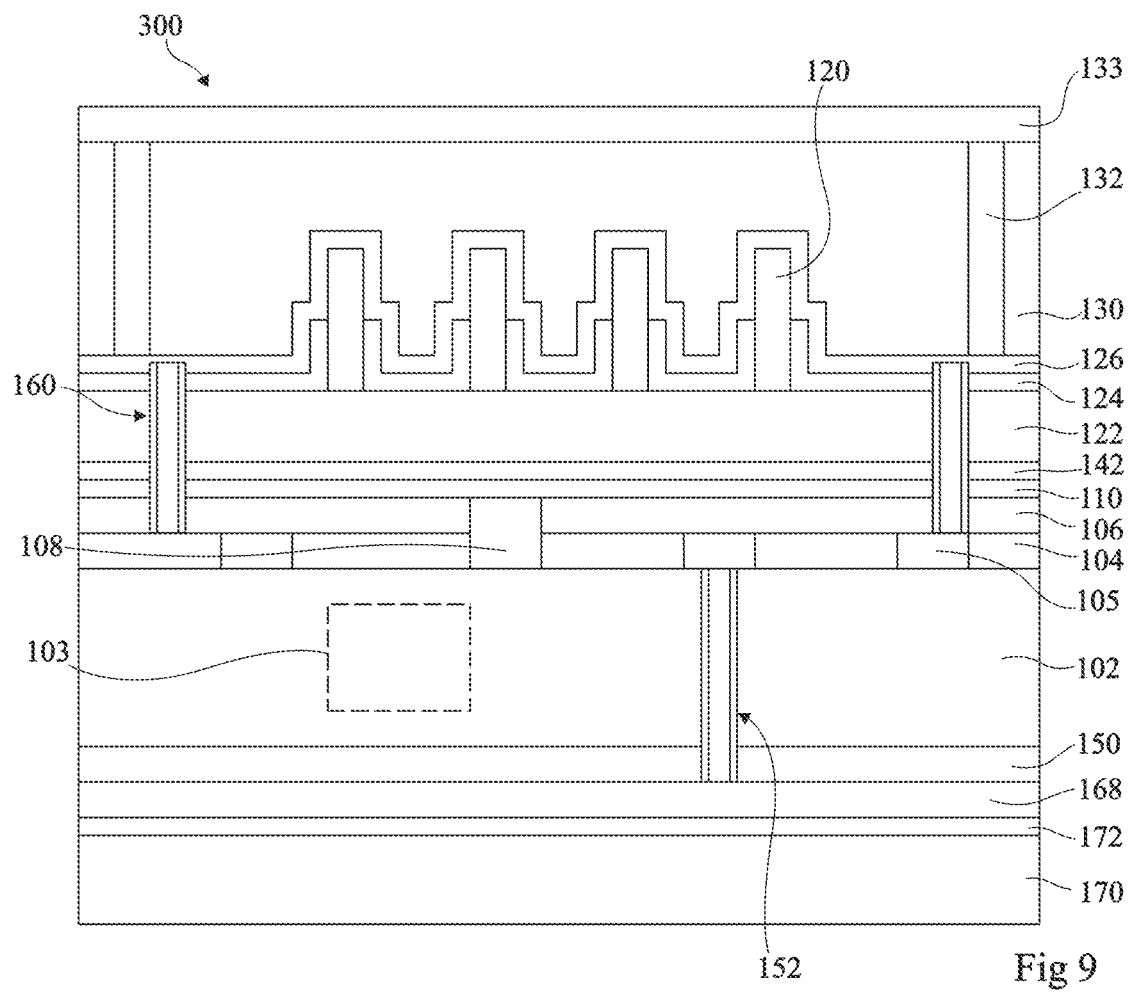
FIG. 9 illustrates a portion of another embodiment of an optoelectronic device.

FIG. 9 illustrates a portion of another embodiment of an optoelectronic device 300. More particularly, FIG. 9 illustrates a display sub-pixel of a display pixel of optoelectronic device 300.

The display sub-pixel of FIG. 9 comprises all the elements of the sub-pixel of FIG. 1, with the difference that the trenches 160 of the embodiment of FIG. 9 only cross insulating layer 106, metal layers 110 and 142, substrate 122, and insulating layer 124. Thus, in operation, the assembly of electronic components 103 receives the first power supply potential via conductive layer 133, walls 132, trenches 160, and conductive tracks 105.

The presence of vias 154 and of conductive tracks 164 is no longer necessary to connect conductive layer 133 to the assembly of electronic components.

Preferably, layers 110 and 142 entirely cover, respectively, the surfaces of electronic circuit 101 and of optoelectronic circuit 121 on which they are formed, except for trenches 160.

Figure 10:
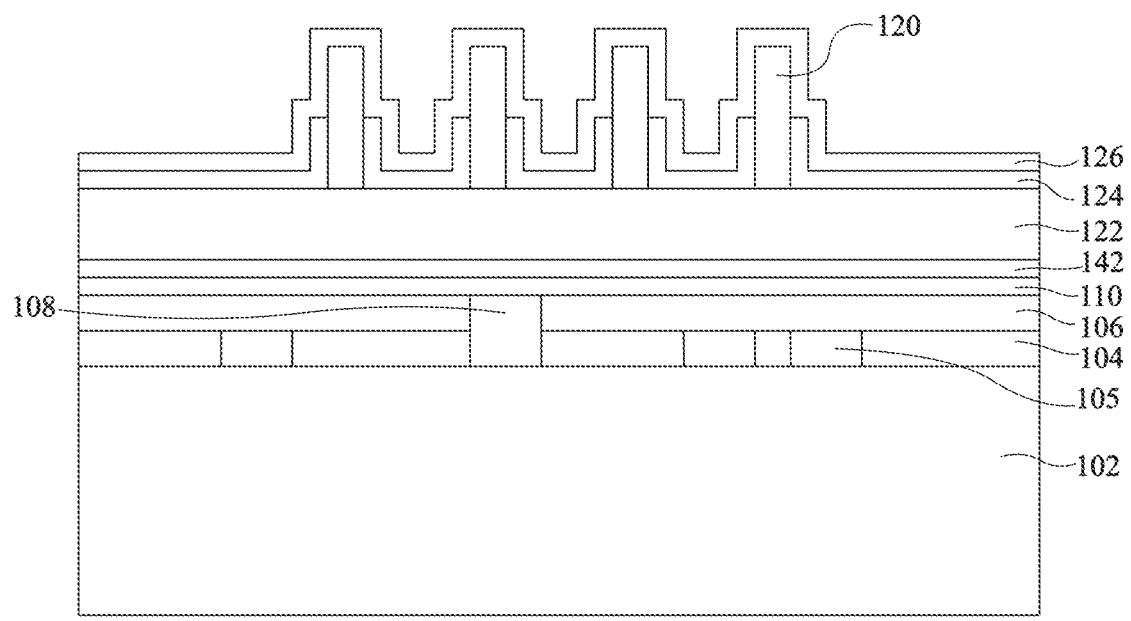
FIG. 10 illustrates the result of steps of the embodiment of a method of manufacturing the device of FIG. 9.
Figure 11:
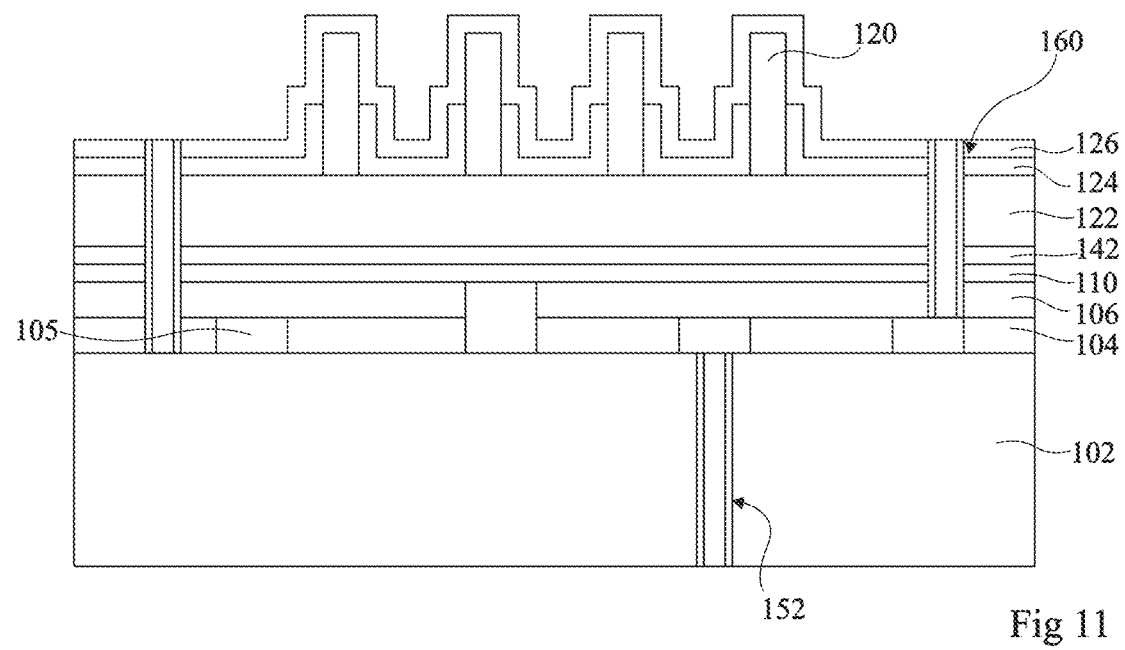
FIG. 11 illustrates the result of steps of the embodiment of a method of manufacturing the device of FIG. 9.

FIGS. 10 and 11 illustrate the results of steps, preferably successive, of an embodiment of a method of manufacturing the optoelectronic device 300 of FIG. 9.

FIG. 10 illustrates the result of steps comprising first steps similar to the steps described in relation with FIGS. 2 and 3.

Substrate 122 is then thinned. The thickness of substrate 122 is however maintained sufficiently thick for the manipulation of substrate 122 not to require the use of a handle. Metal layer 142 is then deposited on the free surface of substrate 122. Metal layers 142 and 110 are then placed into contact to bond electronic circuit wafer 101 and optoelectronic circuit wafer 121 by molecular bonding as previously described.

FIG. 11 illustrates the result of steps during which insulated conductive trenches 160 are formed, from the free surface of conductive layer 126. Trenches 160 comprise an electrically-conductive core and an electrically-insulating sheath. The sheaths are formed in such a way that the conductive core is in contact with the conductive layer 126 forming the electrode. Trenches 160 are formed to reach conductive tracks 105 in places.

Trenches 160 are thus formed after the placing into contact of optoelectronic circuit 121 and of electronic circuit 121.

Insulated conductive vias 152 are formed through substrate 102 to form a connection between the free surface of substrate 102 and of conductive tracks 105.

Preferably, layers 110 and 142 entirely cover the surfaces of electronic and optoelectronic circuits 101 and 121 on which they are formed before the forming of trenches 160. After the forming of trenches 160, layers 110 and 142 preferably entirely cover the surfaces of electronic and optoelectronic circuits 101 and 121 on which they are formed except for trenches 160, which cross them.

During subsequent steps, conductive walls 132 are formed on layer 126. The photoluminescent layer 130 of each sub-pixel is deposited on the light-emitting diodes of the concerned sub-pixel.

In the example of FIGS. 1 and 9, walls 132 are not in contact with trenches 160. As a variant, the walls 132 of the embodiments of FIGS. 1 and 9 may be formed in direct contact with an end of trenches 160. Possibly, walls 132 may be in contact with conductive layer 126 and an end of trenches 160.

During these subsequent steps, a handle, not shown, is also formed on photoluminescent layers 130. Further, conductive layer 168 is formed on the free surface of substrate 102, connected to vias 152. The display pixels are then individualized. The display pixels and the display sub-pixels are thus ready to be deposited on support 170 to form a display screen, as previously described in relation with FIG. 8. Conductive layer 133 is then deposited on the display sub-pixels.

As a variant of the embodiments illustrated in the previous drawings, metal layers 142 and 110 may only partially cover substrate 122 and layer 106. The portions which are not covered with layers 142 and 110 may be covered with another material, for example, an insulating material. The optoelectronic circuit wafer and the electronic circuit wafer are then bonded by hybrid molecular bonding.

Figure 12:
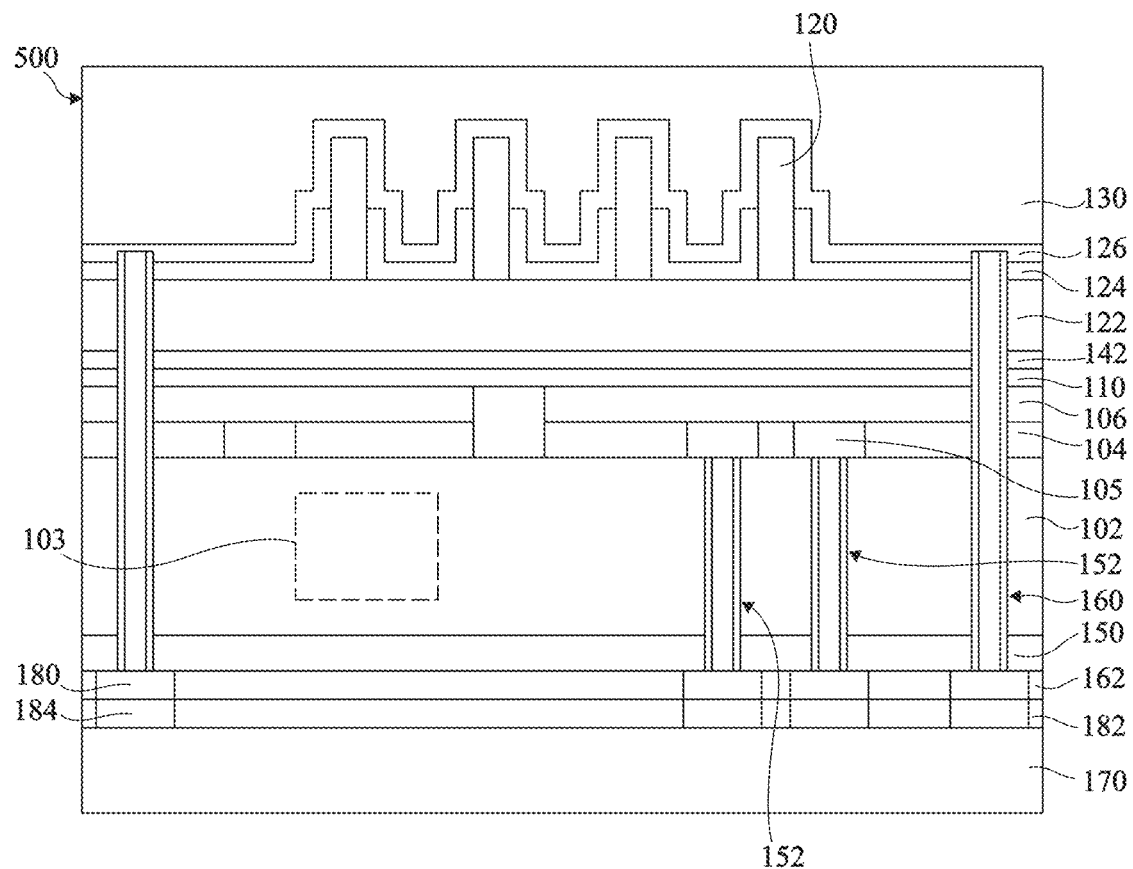
FIG. 12 illustrates a portion of another embodiment of an optoelectronic device.

FIG. 12 illustrates a portion of another embodiment of an optoelectronic device 500. More particularly, FIG. 12 illustrates a display sub-pixel of a display pixel of optoelectronic device 500.

Conversely to the display sub-pixels of FIGS. 1 and 9, the display sub-pixel of the embodiment shown in FIG. 12 comprises neither conductive layer 133 covering insulating layer 130 nor conductive walls 132 in photoluminescent layer 130.

Trenches 160 cross, as in the embodiment of FIG. 1, insulating layer 124, substrate 122, metal layers 142 and 110, insulating layers 106 and 104, substrate 102, and insulating layer 150. Thus, trenches 160 connect electrode 126 to conductive tracks 180 located in insulating layers 162. There may possibly be a single insulating layer 162.

Preferably, layers 110 and 142 entirely cover, respectively, the surfaces of electronic circuit 101 and of optoelectronic circuit 121 on which they are formed, except for trenches 160.

Support 170 is not covered with metal layer 172 but with a stack of at least one insulating layer 182 and of conductive tracks 184. Tracks 184 are located in such a way that each track 180 is in contact with a track 184. Layers 182 and 162 are thus bonded by hybrid molecular bonding. Layers 182 and 162 may possibly be bonded in another way. Such other ways are described in U.S. Pat. Nos. 8,898,896 B2 and 8,586,409 B2.

In operation, a voltage is applied to electrode 126 via tracks 184 and 180 and trenches 160, and conductive tracks 184 may for example extend in insulating layer 182 all the way to other pads, not shown. Each assembly of electronic components is connected to voltage sources, for example, to a power supply voltage source and to ground, via conductive tracks 180 and 184, insulated conductive vias 152, and conductive tracks 105.

Figure 13:
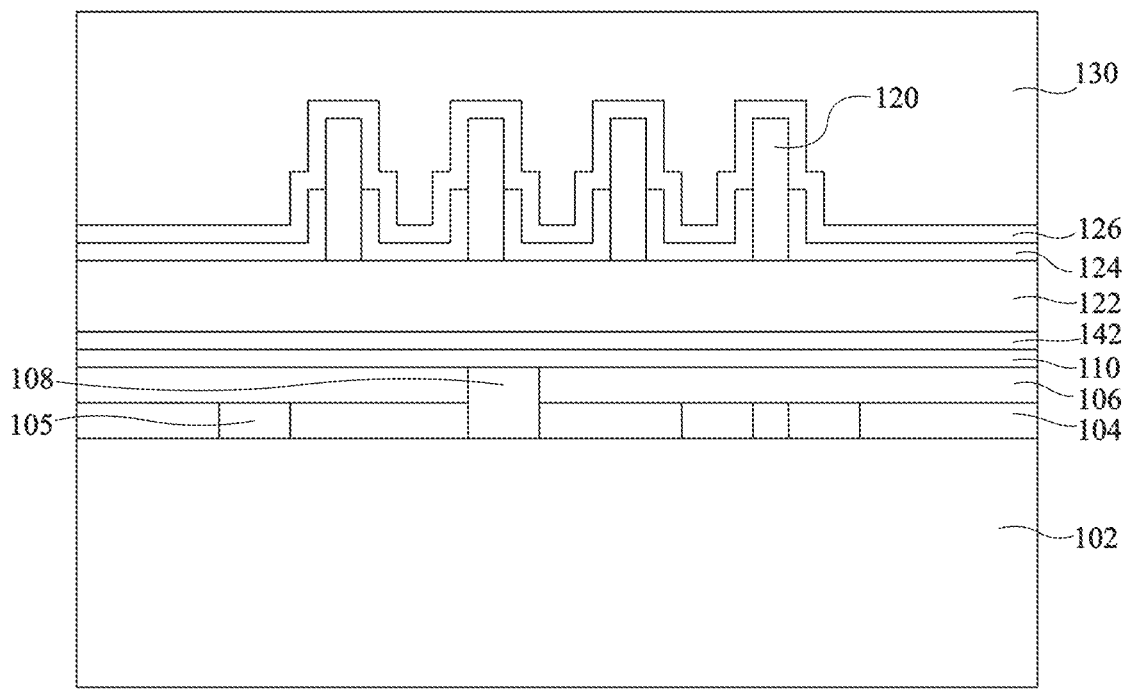
FIG. 13 illustrates the result of steps of the embodiment of a method of manufacturing the device of FIG. 12.
Figure 14:
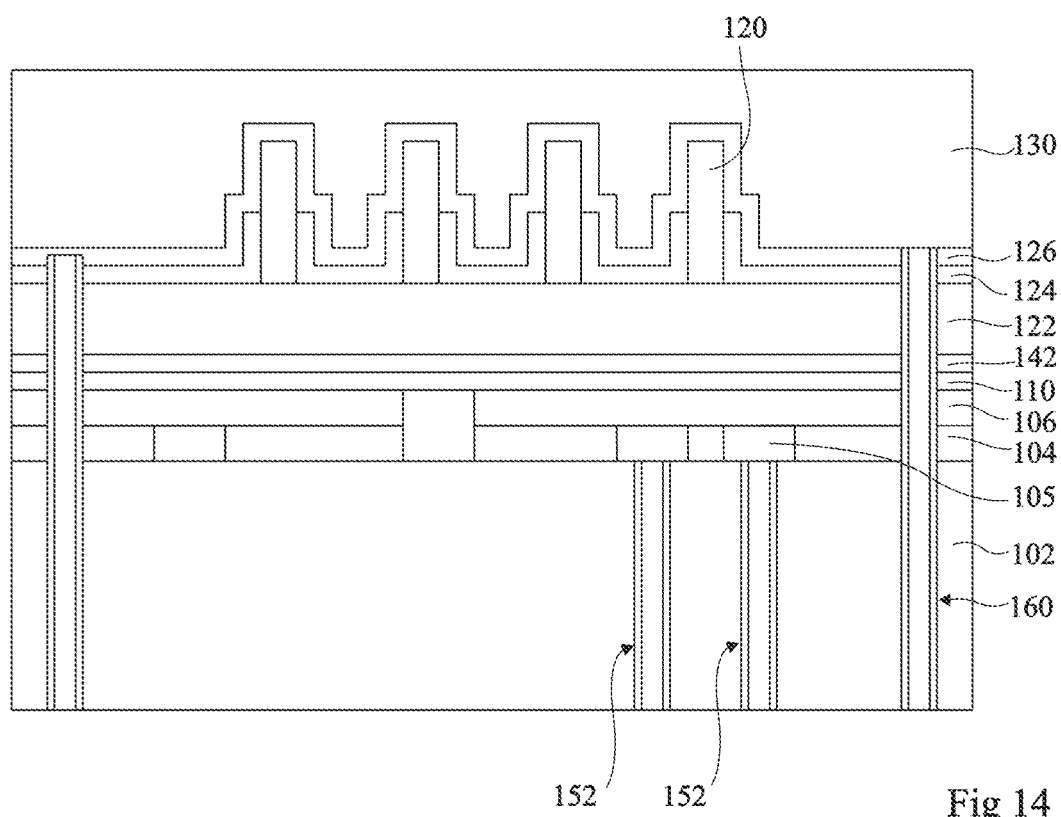
FIG. 14 illustrates the result of steps of the embodiment of a method of manufacturing the device of FIG. 12.

FIGS. 13 and 14 illustrate the results of steps, preferably successive, of an embodiment of a method of manufacturing the optoelectronic device 500 of FIG. 12.

FIG. 13 illustrates the result of steps comprising first steps similar to the steps previously described in relation with FIGS. 2 and 3. Insulating layer 130 is then deposited on electrode 126 for each display sub-pixel. However, walls 132 are not formed. A handle, not shown, is also bonded to photoluminescent layers 130, to be able to manipulate the optoelectronic circuit wafer. Metal layer 142 is deposited on the free surface of substrate 122. Metal layers 110 and 142 are bonded to each other by metal-to-metal molecular bonding. As a variant, substrate 122 may be totally removed.

FIG. 14 illustrates the result of steps during which insulated conductive vias 152 are formed from the free surface of substrate 102 to reach conductive tracks 105. Insulating conductive trenches 160 are formed from the free surface of substrate 102 and surround each display sub-pixel. Trenches 160 cross substrate 102, layers 104 and 106, metal layers 142 and 110, substrate 122, and insulating layer 124. Thus, insulating trenches 160 form a connection between the free surface of substrate 102 and electrode 126.

Trenches 160 are thus formed after the placing into contact of optoelectronic circuit 121 and of electronic circuit 121.

Preferably, layers 110 and 142 entirely cover the surfaces of electronic and optoelectronic circuits 101 and 121 on which they are formed before the forming of trenches 160. After the forming of trenches 160, layers 110 and 142 preferably entirely cover the surfaces of electronic and optoelectronic circuits 101 and 121 on which they are formed except for trenches 160, which cross them.

During subsequent steps, insulating layer 162 and conductive tracks 180 are formed.

The display pixels and the display sub-pixels are ready to be deposited on a chip to form a display screen. A step similar to the step described in relation with FIG. 8 is carried out after the steps having their result illustrated in FIG. 14. It is not necessary to deposit a conductive layer on photoluminescent layers 130 after the removal of the handle. There are no conductive walls allowing the connection with electrode 126. Further, each display pixel is not deposited on a single pad, as previously described in relation with FIG. 8, but on insulating layer 182 and conductive 184 to be able to separately connect trenches 160 and the different vias 152.

An advantage of trenches 160 is that they enable to insulate the portions of layers 110 and 142 of each display sub-pixel and to individualize the connection of each assembly of light-emitting diodes.

An advantage of the previously-described embodiments is that the positioning, on the one hand of substrate 122 on substrate 102, and on the other hand of display pixels 169 on the chips forming display screens, is carried out by manipulating the full wafers and not only elements one by one. Thus, the method is faster than a method using a so-called pick-and-place technique.

An advantage of the previously-described embodiments is that, for each display sub-pixel, the connection between the assembly of light-emitting diodes and the assembly of associated electronic components 103 is performed via layers 142 and 110. Thus, it is not necessary for the assemblies of light-emitting diodes and the assemblies of electronic components 103 to be perfectly aligned. This is also true for the connection between display pixels 169 and pads 172 in the embodiments of FIGS. 1 and 9.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional indications provided hereinabove.

The invention claimed is:

1. A method of manufacturing an optoelectronic device, comprising the steps of:
    forming, on a first surface of a first wafer comprising assemblies of electronic components, a stack of first insulating layers and of conductive tracks;
    forming, on a second wafer, assemblies of three-dimensional light-emitting diodes, each comprising first and second ends;
    forming a first metal layer on at least a portion of the first surface of the first wafer and a second metal layer on at least a portion of a first surface of the second wafer, the second metal layer being electrically coupled to the first end of each light-emitting diode;
    placing into contact the first and second metal layers to bond them by molecular bonding;
    forming at least one insulated conductive via connecting a second surface of the first wafer to one of the conductive tracks; and
    forming, after having placed into contact the first and second metal layers, insulated conductive trenches surrounding each assembly of light-emitting diodes and laterally insulating from one another portions of the first and second metal layers, each portion being connected to one of the assemblies of light-emitting diodes.

2. The method according to claim 1, wherein some of the conductive tracks interconnect the assemblies of electronic components of the first wafer and wherein conductive elements extend in the first insulating layers of the stack and are in contact with the first metal layer.

3. The method according to claim 2, wherein each portion of the first and second metal layers surrounded with a trench is connected to the first wafer by one of the conductive elements.

4. The method according to claim 1, wherein the forming the first metal layer and the second metal layer, the first and second metal layers totally cover the first surfaces of the first and second wafers.

5. The method according to claim 1, comprising a step of forming of an electrode electrically connecting the second ends of all the light-emitting diodes.

6. The method according to claim 5, wherein the insulated conductive trenches extend from the electrode to some of the conductive tracks.

7. The method according to claim 5, wherein the insulated conductive trenches extend from the second surface of the first wafer to the electrode.

8. The method according to claim 5, wherein the first and second metal layers are placed into contact before forming of a photoluminescent layer covering the electrode.

9. The method according to claim 1, wherein each trench is connected to one of the at least one insulated conductive via.

10. The method according to claim 1, comprising the forming of a second insulating layer covering the light-emitting diodes, the second insulating layer being crossed by electrically-conductive walls.

11. An optoelectronic device comprising:
    a first chip comprising assemblies of electronic components and a stack of first insulating layers and of conductive tracks, a first surface of the first chip being at least partially covered with a first metal layer, at least one insulated conductive via connecting a second surface of the first chip to one of the conductive tracks;
    a second chip comprising assemblies of three-dimensional light-emitting diodes, each light-emitting diode having a first end and a second end, a first surface of the second chip being at least partially covered with a second metal layer, the second metal layer being electrically coupled to the first ends of all the light-emitting diodes, the first and second metal layers being bonded to each other by molecular bonding; and
    insulated conductive trenches surrounding each assembly of light-emitting diodes, crossing the first and second metal layers and laterally insulating portions of the first and second metal layers connected to each assembly of light-emitting diodes.

12. The device according to claim 11, wherein some of the conductive tracks interconnect the assemblies of electronic components of the first chip and conductive elements comprised within the first insulating layers of the stack are in contact with the first metal layer.

13. The device according to claim 12, wherein each portion of the first and second metal layers surrounded with a trench is connected to the first chip by one of the conductive elements.

14. The device according to claim 11, wherein the first and second metal layers cover the first surfaces of the first and second chips.

15. The device according to claim 11, wherein an electrode electrically connects the second ends of all the light-emitting diodes.

16. The device according to claim 15, wherein the insulated conductive trenches extend from the electrode to the conductive tracks of the stack.

17. The device according to claim 15, wherein the insulated conductive trenches extend from the second surface of the first chip to the electrode.

18. The device according to claim 11, wherein each trench is connected to one of the at least one insulated conductive via.

19. The device according to claim 11, wherein a second insulating layer covers the light-emitting diodes, the second insulating layer being crossed by electrically-conductive walls.

20. The device according to claim 11, wherein the second metal layer is in contact with the first ends of the light-emitting diodes.

* * * * *